US009491871B2

(12) United States Patent
Chan et al.

(10) Patent No.: US 9,491,871 B2
(45) Date of Patent: Nov. 8, 2016

(54) CARRIER SUBSTRATE

(71) Applicant: Unimicron Technology Corp., Taoyuan (TW)

(72) Inventors: Ying-Chih Chan, Taoyuan (TW); Chun-Ting Lin, Changhua County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 14/977,669

(22) Filed: Dec. 22, 2015

(65) Prior Publication Data

US 2016/0113114 A1 Apr. 21, 2016

Related U.S. Application Data

(63) Continuation-in-part of application No. 13/966,295, filed on Aug. 14, 2013, now Pat. No. 9,247,654.

(30) Foreign Application Priority Data

May 7, 2013 (TW) .............................. 102116226 A (51) Int. Cl.
*H05K 1/00* (2006.01)
*H05K 3/40* (2006.01)
(Continued)

(52) U.S. Cl.
CPC .......... *H05K 3/4015* (2013.01); *H05K 3/0097* (2013.01); *H05K 3/4644* (2013.01);
(Continued)

(58) Field of Classification Search
CPC .......... H01B 5/00; H05K 1/112; H05K 1/00; H05K 3/0097; H05K 3/4015; H05K 3/4644; H05K 3/4688; H05K 3/244; H05K 3/465; H05K 3/0038; H05K 3/06; H05K 3/4661; H05K 2201/09509; H05K 2201/09827; H05K 2203/041; H05K 2203/1536; H05K 2203/0384; H05K 2203/0723; H05K 2203/0307; H01L 21/68; H01L 21/44; H01L 21/563; H01L 21/441; H01L 21/76832; H01L 21/76835; H01L 21/76808; H01L 21/76825; H01L 21/76801; H01L 21/76826; H01L 21/76828; H01L 21/76804; H01L 21/7682; H01L 23/52; H01L 23/49811; H01L 23/49816; H01L 23/49822; H01L 23/5283; H01L 23/5329; H01L 23/5222; H01L 23/53295; H01L 23/49866; H01L 24/13; H01L 24/16; H01L 29/0649; H01L 2221/1031; H01L 2224/16225; H01L 2224/32225; H01L 2224/48227; H01L 2224/48228; H01L 2224/73204; H01L 2224/73265; H01L 2924/0002; H01L 2924/01322; H01R 43/00; C23F 1/02; G02F 1/13; Y10T 29/49155

USPC ........ 29/885; 156/247; 174/126.1, 250, 251, 174/257, 258, 261, 262, 266; 216/11, 13, 216/20; 257/737, 721, 769, 770, 774, 741, 257/E21.159, E23.011; 427/125; 438/614, 438/667

See application file for complete search history.

(56) References Cited

U.S. PATENT DOCUMENTS

2001/0000155 A1* 4/2001 Huang .............. H01L 21/76804
438/597
2008/0012115 A1* 1/2008 Zilber ................. H01L 23/3114
257/690

(Continued)

FOREIGN PATENT DOCUMENTS

JP 2004253761 9/2004
JP 2012-186296 9/2012

(Continued)

*Primary Examiner* — Timothy Thompson
*Assistant Examiner* — Guillermo Egoavil
(74) *Attorney, Agent, or Firm* — Jianq Chyun IP Office (57) ABSTRACT

A carrier substrate includes a dielectric layer, a first circuit layer, an insulation layer, conductive blocks, and a first conductive structure. The dielectric layer has a first surface, a second surface, and blind vias. The first circuit layer is embedded in the first surface and the blind vias extend from the second surface to the first circuit layer. The insulation layer is disposed on the first surface and has a third surface, a fourth surface, and first openings exposing the first circuit layer. The conductive blocks fill the first openings and connect with the first circuit layer. A top surface of each of the conductive blocks is higher than the third surface of the insulation layer. The first conductive structure includes conductive vias filling the blind vias and a second circuit layer disposed on a portion of the second surface.

8 Claims, 9 Drawing Sheets

(51) Int. Cl.
    *H05K 3/00* (2006.01)
    *H05K 3/46* (2006.01)
(52) U.S. Cl.
    CPC ............... *H05K2201/09509* (2013.01); *H05K 2201/09827* (2013.01); *H05K 2203/041* (2013.01); *H05K 2203/1536* (2013.01)

(56) References Cited

U.S. PATENT DOCUMENTS

| | | | |
|---|---|---|---|
| 2008/0217047 A1* | 9/2008 | Hu | H01L 23/49811 174/257 |
| 2009/0046409 A1* | 2/2009 | Kweon | H05K 1/162 361/303 |
| 2010/0163517 A1* | 7/2010 | Wang | B41J 2/1601 216/11 |
| 2012/0175732 A1* | 7/2012 | Lin | H01L 23/49816 257/531 |
| 2012/0261828 A1 | 10/2012 | Bruce et al. | |
| 2012/0312588 A1 | 12/2012 | Tseng et al. | |
| 2013/0214387 A1* | 8/2013 | Lin | H01L 21/768 257/538 |

FOREIGN PATENT DOCUMENTS

| | | |
|---|---|---|
| TW | 201021182 | 6/2010 |
| TW | 201027681 | 7/2010 |
| TW | 201108367 | 3/2011 |
| TW | 201220964 | 5/2012 |

\* cited by examiner

CARRIER SUBSTRATE

CROSS-REFERENCE TO RELATED APPLICATION

This application is a continuation-in-part application of and claims the priority benefit of U.S. application Ser. No. 13/966,295, filed on Aug. 14, 2013, now allowed, which claims the priority benefit of Taiwan application serial no. 102116226, filed on May 7, 2013. The entirety of each of the above-mentioned patent applications is hereby incorporated by reference herein and made a part of this specification.

BACKGROUND OF THE INVENTION

Field of the Invention

The invention relates to a substrate, and more particularly, to a carrier substrate suitable for carrying components.

Description of Related Art

In recent years, with the rapid progress of the electronic technology, high-tech electronic industries have appeared one after another, thus more human-oriented, more performance-preferred electronic products are continuously evolving new things from the old, and have been designed to cater to the trend of being low-profiled and compact-sized. A carrier substrate is usually disposed in the electronic products. The carrier substrate, in addition to having conductive circuits, can also carry components such as capacitors, inductors, resistors, IC chips, or package bodies to be used as data processing units of electronic products.

However, the connection pads and the traces on the known carrier substrate are on the same horizontal plane, and the openings of the solder mask layer expose the connection pads and the traces in the pre-connection region at the same time. Therefore, the arrangements not only affect electrical performance by readily generating oxidation phenomenon to the traces, the user also cannot easily distinguish the connection pads from the traces, and therefore the component cannot be directly connected with the connection pads accurately. Therefore, effectively allowing the user to directly connect the component to the connection pads and preventing the traces from being exposed from the outside of the solder mask layer are one of the goals industries today are actively working toward.

SUMMARY OF THE INVENTION

The invention provides a carrier substrate which can allow the user to easily distinguish connection pads for components and can prevent the generation of oxidation phenomenon from exposed traces.

The carrier substrate of the invention includes a dielectric layer, a first circuit layer, an insulation layer, a plurality of conductive blocks, and a first conductive structure. The dielectric layer has a first surface and a second surface opposite to each other and a plurality of blind vias. The first circuit layer is embedded in the first surface of the dielectric layer and has an upper surface and a lower surface opposite to each other. The upper surface is exposed from the first surface of the dielectric layer. The blind vias extend from the second surface to the first circuit layer and expose a portion of the lower surface of the first circuit layer. The insulation layer has a third surface and a fourth surface opposite to each other. The insulation layer is disposed on the first surface of the dielectric layer through the fourth surface, and covers a portion of the upper surface of the first circuit layer. The insulation layer has a plurality of first openings extending from the third surface to the fourth surface. The first openings expose another portion of the upper surface of the first circuit layer and the aperture of each first opening is increased gradually from the third surface to the fourth surface. Moreover, the apertures of the first openings on the fourth surface are greater than the width of the exposed first circuit layer. The conductive blocks are respectively disposed in the first openings of the insulation layer and connected with another portion of the upper surface of the first circuit layer exposed by the first openings. A top surface of each of the conductive blocks is higher than the third surface of the insulation layer. The first conductive structure is disposed on the second surface of the dielectric layer and includes a plurality of conductive vias filling the blind vias and a second circuit layer disposed on a portion of the second surface.

In an embodiment of the invention, a height difference is between the top surface of each of the conductive blocks and the third surface of the insulation layer, and the height difference is at least greater than or equal to a thickness of the insulation layer.

In an embodiment of the invention, the carrier substrate further includes a first surface treatment layer disposed on the top surface of each of the conductive blocks and extending along a side surface of each of the conductive blocks on the third surface of the insulation layer.

In an embodiment of the invention, the side surface of each of the conductive blocks is an inclined surface.

In an embodiment of the invention, a material of the first surface treatment layer includes organic solderability preservative (OSP), electroplating Ni/Au, electroplating Ni/Pd, electroplating Sn, electroplating Ag, electroless Au, electroless nickel electroless palladium immersion gold (ENEPIG) or a combination thereof.

In an embodiment of the invention, the carrier substrate further includes a solder mask layer disposed on another portion of the second surface of the dielectric layer and covering a portion of the second circuit layer of the first conductive structure, wherein the solder mask layer has a plurality of second openings exposing another portion of the second circuit layer.

In an embodiment of the invention, the carrier substrate further includes a second surface treatment layer disposed on another portion of the second circuit layer.

In an embodiment of the invention, a material of the second surface treatment layer includes organic solderability preservative (OSP), electroplating Ni/Au, electroplating Ni/Pd, electroplating Sn, electroplating Ag, electroless Au, electroless nickel electroless palladium immersion gold (ENEPIG) or a combination thereof.

Based on the above, the first openings of the insulation layer of the invention expose a portion of the first circuit layer and the conductive blocks are disposed on the first circuit layer exposed by the first openings. As a result, the conductive blocks can be used as a structure for elevating a portion of the first circuit layer. At the same time, the conductive blocks can be viewed as bonding pads for components. In this way, in subsequent applications of the carrier substrate of the invention in carrying components (such as capacitors, inductors, resistors, IC chips, or package), the component can be accurately connected with the conductive blocks to increase the reliability of bonding between the carrier substrate and the component. Moreover, the insulation layer covers another portion of the first circuit layer, which can protect the first circuit layer to prevent the generation of oxidation phenomenon so as to maintain the electrical performance of the first circuit layer.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3F' illustrates a cross-sectional schematic diagram of a carrier substrate of an embodiment of the invention.

FIG. 4' illustrates a cross-sectional schematic diagram of a carrier substrate of another embodiment of the invention.

FIG. 4" illustrates a cross-sectional schematic diagram of a carrier substrate of yet another embodiment of the invention.

DESCRIPTION OF THE EMBODIMENTS

Figure 1A:
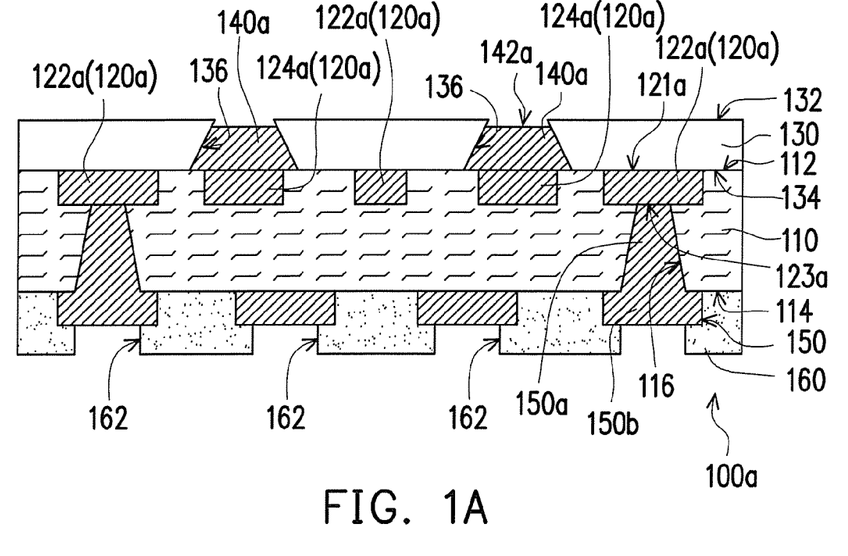
FIG. 1A illustrates a cross-sectional schematic diagram of a carrier substrate of an embodiment of the invention.
Figure 1B:
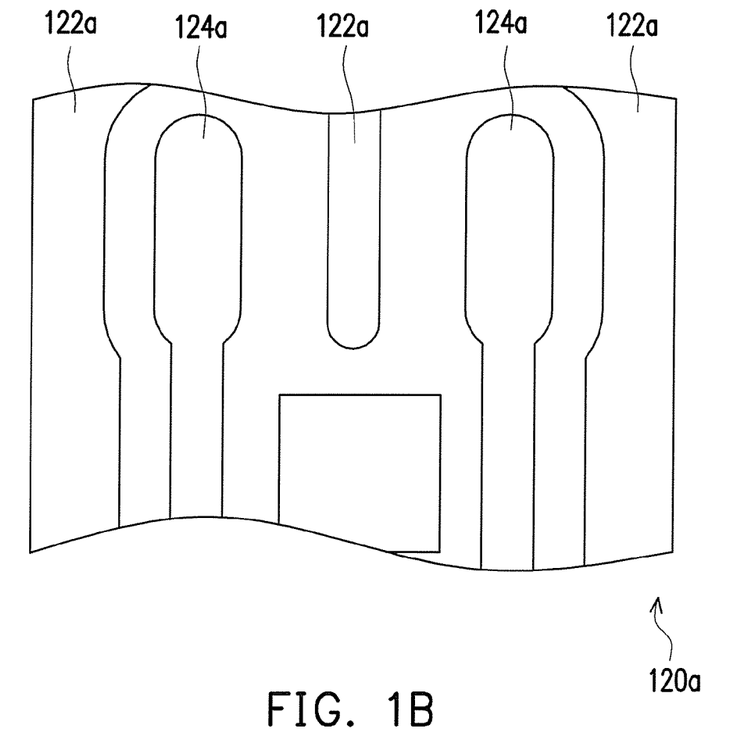
FIG. 1B illustrates a schematic top view of the circuit layer of FIG. 1A.

FIG. 1A illustrates a cross-sectional schematic diagram of a carrier substrate of an embodiment of the invention. FIG. 1B illustrates a schematic top view of the circuit layer of FIG. 1A. Referring first to FIG. 1A, in the present embodiment, a carrier substrate 100a includes a dielectric layer 110, a first circuit layer 120a, an insulation layer 130, a plurality of conductive blocks 140a, and a first conductive structure 150. Specifically, the dielectric layer 110 has two opposing surfaces 112 and 114 and a plurality of blind vias 116 (FIG. 1A schematically illustrates two). The first circuit layer 120a is embedded in the surface 112 of the dielectric layer 110 and has two opposing surfaces 121a and 123a, wherein the surface 121a is exposed from the surface 112 of the dielectric layer 110. The blind vias 116 extend from the surface 114 to the first circuit layer 120a and expose a portion of the surface 123a of the first circuit layer 120a. The insulation layer 130 has two opposing surfaces 132 and 134, is disposed on the surface 112 of the dielectric layer 110 through the surface 134, and covers a portion of the surface 121a of the first circuit layer 120a. The insulation layer 130 has a plurality of first openings 136 extending from the surface 132 to the surface 134. The first openings 136 expose another portion of the surface 121a of the first circuit layer 120a, the aperture of each first opening 136 is increased gradually from the surface 132 to the surface 134, and the apertures of the first openings 136 on the surface 134 are greater than the width of the exposed first circuit layer 120a. The conductive blocks 140a are respectively disposed in the first openings 136 of the insulation layer 130 and connected with another portion of the surface 121a of the first circuit layer 120a exposed by the first openings 136. The first conductive structure 150 is disposed on the surface 114 of the dielectric layer 110. The conductive structure 150 includes conductive vias 150a filling the blind vias 116 and a second circuit layer 150b disposed on a portion of the surface 114. Moreover, the carrier substrate 100a of the present embodiment can further include a solder mask layer 160, wherein the solder mask layer 160 is disposed on another portion of the surface 114 of the dielectric layer 110 and covers a portion of the second circuit layer 150b of the first conductive structure 150, wherein the solder mask layer 160 has a plurality of second openings 162 exposing another portion of the second circuit layer 150b.

More specifically, referring to both FIG. 1A and FIG. 1B, the first circuit layer 120a of the present embodiment includes a plurality of traces 122a and a plurality of connection pads 124a, wherein the first openings 136 expose a portion of the connection pads 124a. In other words, the traces 122a are covered by the insulation layer 130, which can prevent generation of oxidation phenomenon due to the traces 122a being exposed from the outside, thus maintaining the electrical performance of the traces 122a. As shown in FIG. 1A, the surface 121a of the first circuit layer 120a of the present embodiment is substantially exposed from the surface 112 of the dielectric layer 110 and the conductive blocks 140a fill the first openings 136 and directly connect with the connection pads 124a structurally and electrically, wherein the first circuit layer 120a and the conductive blocks 140a can be an integral structure. In this way, the conductive blocks 140a can be viewed as an elevating structure of the connection pads 124a. As a result, in subsequent applications of the carrier substrate 100a of the present embodiment in carrying components (such as capacitors, inductors, resistors, IC chips, or package) (not illustrated), the component can be accurately connected with the conductive blocks 136 to increase the reliability of bonding between the carrier substrate 100a and the component. Moreover, one surface 142a of the conductive blocks 140a of the present embodiment is substantially lower than or level with (not illustrated) the surface 132 of the insulation layer 130 and the sectional shape of the conductive blocks 140a is, for instance, a trapezoid, but is not limited thereto.

It should be mentioned here that, the same reference numerals as the previous embodiment and part of the contents thereof are used in the following embodiments, wherein the same numerals are used to represent the same or similar components and descriptions of the same technical contents are omitted. The omitted portion is described in the previous embodiment and is not repeated in the following embodiments.

Figure 2A:
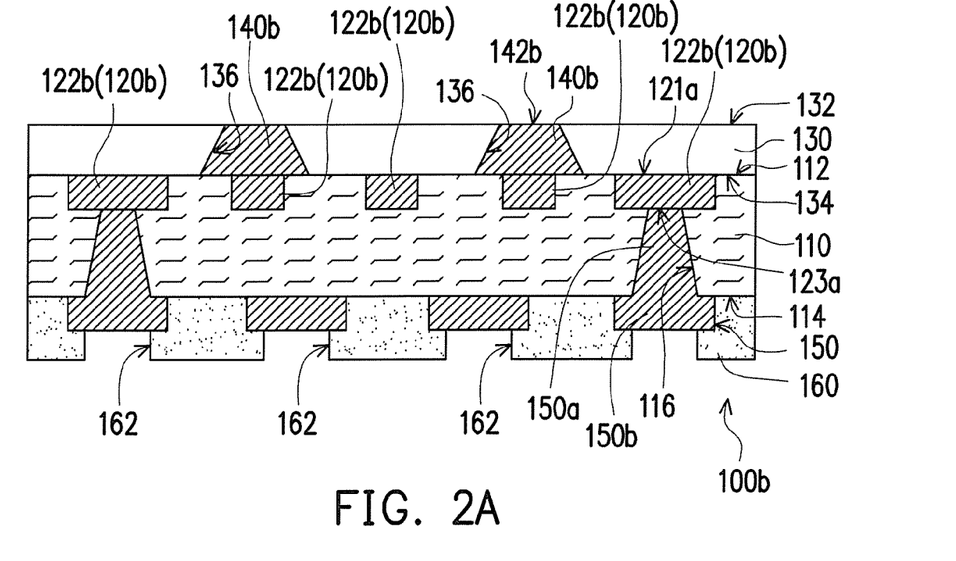
FIG. 2A illustrates a cross-sectional schematic diagram of a carrier substrate of another embodiment of the invention.
Figure 2B:
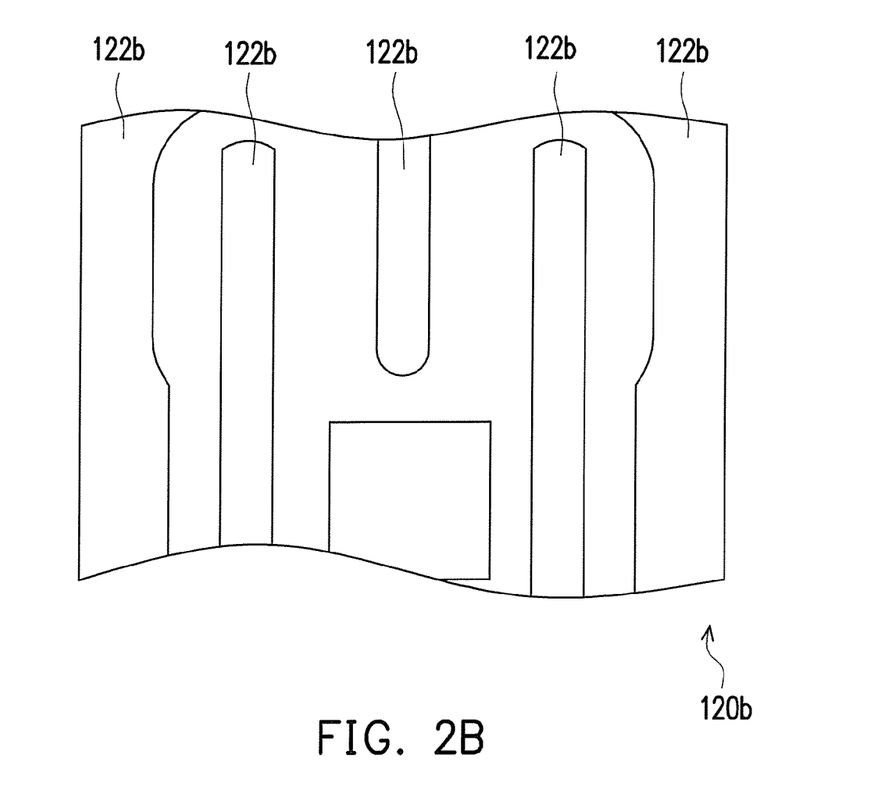
FIG. 2B illustrates a schematic top view of the circuit layer of FIG. 2A.

FIG. 2A illustrates a cross-sectional schematic diagram of a carrier substrate of another embodiment of the invention. FIG. 2B illustrates a schematic top view of the circuit layer of FIG. 2A. Referring to both FIG. 2A and FIG. 2B, the carrier substrate 100b of the present embodiment is similar to the carrier substrate 100a of FIG. 1A, with the difference being that the first circuit layer 120b of the present embodiment is only composed of a plurality of traces 122b and a portion of the traces 122b exposed by the first openings 136 can be used as connection pads. Moreover, the surface 142b of the conductive blocks 140b of the present embodiment is substantially level with or lower than (not illustrated) the surface 132 of the insulation layer 130.

In the following, an embodiment and FIG. 3A to FIG. 3F are used to describe the manufacturing method of the carrier substrate 100c in detail.

Figure 3A:
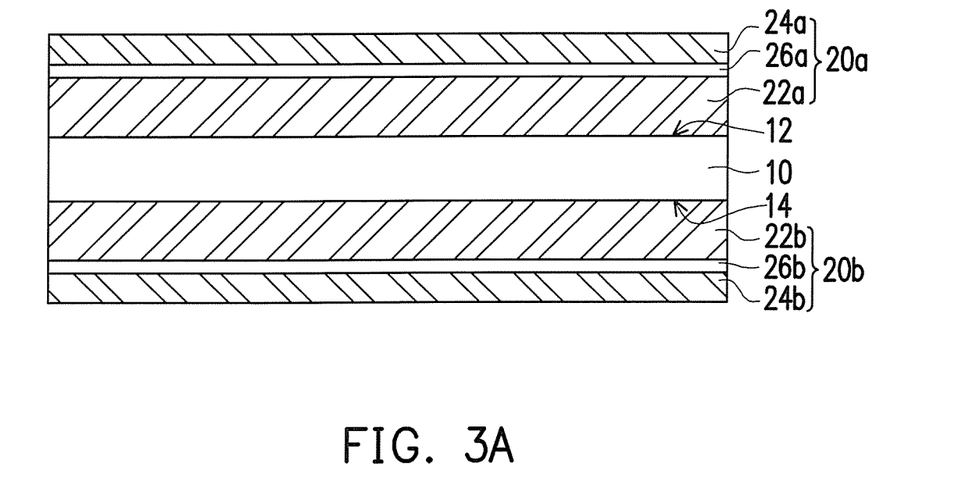
FIG. 3A to FIG. 3F illustrate cross-sectional schematic diagrams of a manufacturing method of a carrier substrate of an embodiment of the invention.

FIG. 3A to FIG. 3F illustrate cross-sectional schematic diagrams of a manufacturing method of a carrier substrate of an embodiment of the invention. Referring first to FIG. 3A, according to the manufacturing method of the carrier substrate 100a of the present embodiment, first, a first copper foil structure 20a and a second copper foil structure 20b are laminated on two opposing surfaces 12 and 14 of a core dielectric layer 10. Specifically, the first copper foil structure 20a of the present embodiment includes a first thick copper foil layer 22a, a first thin copper foil layer 24a, and a first release layer 26a. The first release layer 26a is between the first thin copper foil layer 24a and the first thick copper foil layer 22a. The second copper foil structure 20b includes a second thick copper foil layer 22b, a second thin copper foil layer 24b, and a second release layer 26b. The second release layer 26b is between the second thin copper foil layer 24b and the second thick copper foil layer 22b. The first thick copper foil layer 22a and the second thick copper foil layer 22b are disposed correspondingly on the surfaces 12 and 14 of the core dielectric layer 10.

Figure 3B:
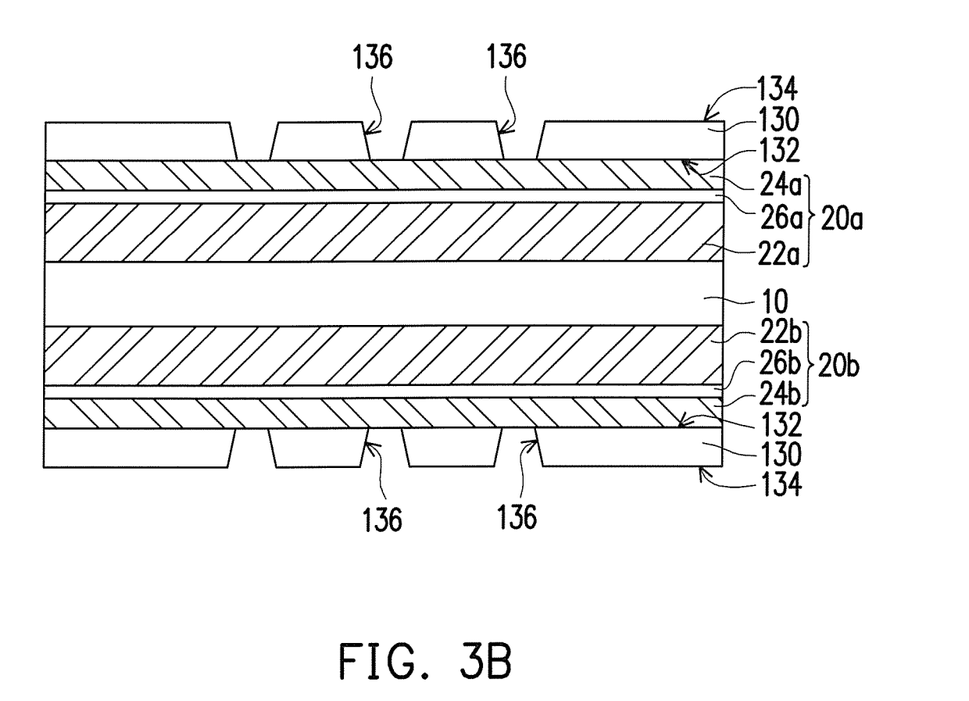

Then, referring to FIG. 3B, two insulation layers 130 respectively having two opposing surfaces 132 and 134 are provided, and the insulation layers 130 are respectively laminated on the first copper foil structure 20a and the second copper foil structure 20b by the surfaces 132, wherein the insulation layers 130 have a plurality of first openings 136 extending from the surfaces 134 to the surfaces 132. In particular, the apertures of the first openings 136 are increased gradually from the surfaces 132 to the surfaces 134. Here, the material of the insulation layers 130 is, for instance, ABF (Ajinomoto build-up film) resin, and the insulation layers 130 are stacked on the first copper foil structure 20a and the second copper foil structure 20b through a method of thermocompression bonding. Moreover, the first openings 136 are, for instance, formed by laser drilling.

Figure 3C:
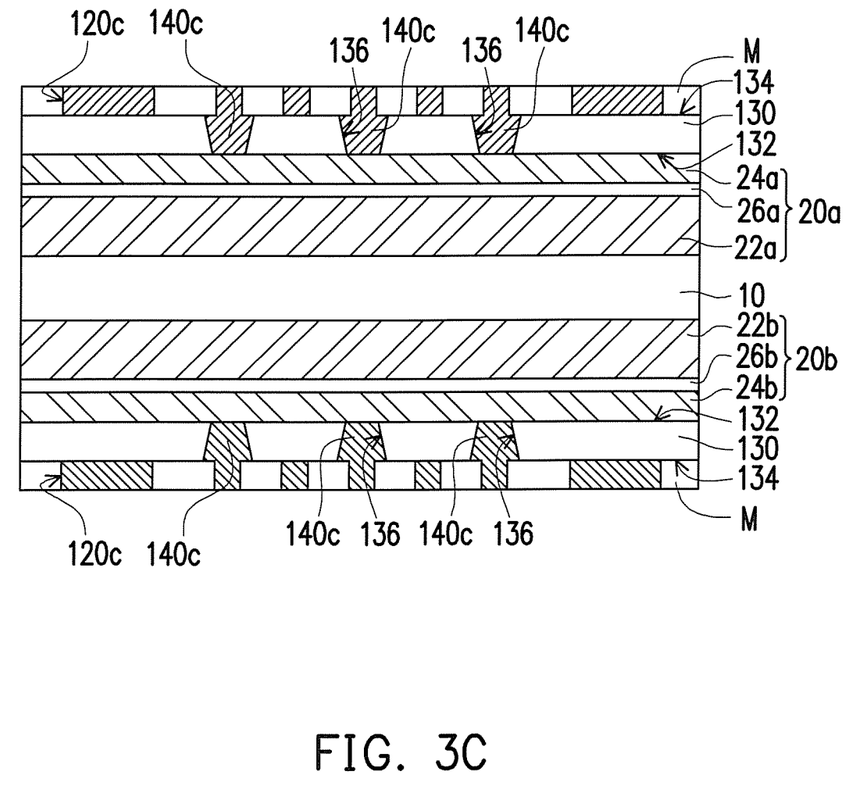

Then, referring to FIG. 3C, a first circuit layer 120c is respectively formed on a portion of the surfaces 134 of the insulation layers 130 and a plurality of conductive blocks 140c fill the first openings 136. Specifically, in the present embodiment, the step of forming the first circuit layers 120c and the conductive blocks 140c includes comprehensively forming a seed layer (not illustrated) on the surfaces 134 of the insulation layers 130 and the surfaces of the first openings 136 and forming a patterned dry film M on the surfaces 134 of the insulation layers 130, wherein the patterned dry film M exposes a portion of the surfaces 134 of the insulation layers 130. Then, an electroplating process is performed to form the first circuit layers 120c on the surfaces 134 of the insulation layers 130 exposed by the patterned dry film M and the conductive blocks 140c filling the first openings 136. Then, the patterned dry film M is removed. In short, the circuit layers 120c and the conductive blocks 140c are integrally formed.

It should be mentioned that, in the present embodiment, the circuit layers 120c can also be composed of only a plurality of traces or composed of a plurality of traces and a plurality of connection pads, wherein the first openings 136 can expose a portion of the traces to be used as connection pads or directly expose a portion of the connection pads. In other words, the traces not used as connection pads are covered by the insulation layers 130, which can prevent the generation of oxidation phenomenon due to the traces being exposed from the outside, thus maintaining the electrical performance of the traces. Moreover, the traces or connection pads exposed by the first openings 136 can be directly connected with the conductive blocks 140c structurally and electrically.

Figure 3D:
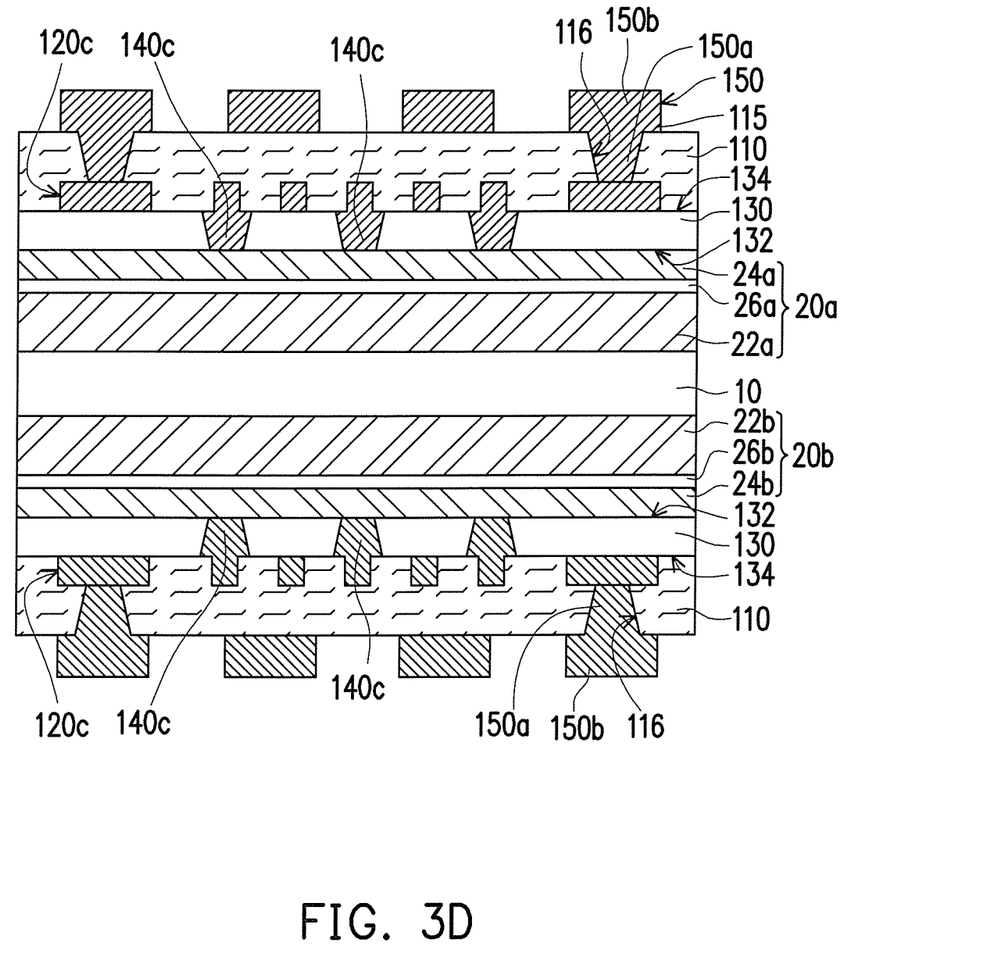

Then, referring to FIG. 3D, a dielectric layer 110 is respectively laminated on another portion of the surfaces 134 of the insulation layers 130 and the first circuit layers 120c, wherein the dielectric layers 110 have a plurality of blind vias 116 extending to a portion of the first circuit layers 120c. Then, referring further to FIG. 3D, a first conductive structure 150 is respectively formed on the dielectric layers 110, wherein the first conductive structures 150 include a plurality of conductive vias 150a filling the blind vias 116 and a plurality of second circuit layers 150b disposed on a portion of the dielectric layers 110.

Figure 3E:
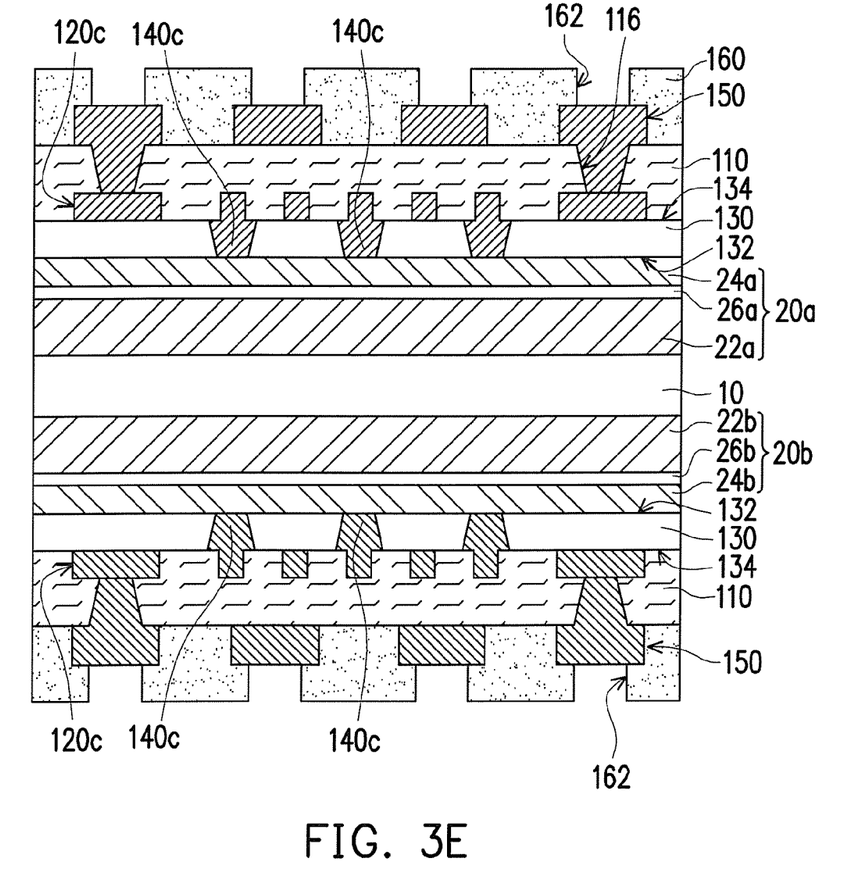

Then, referring to FIG. 3E, a solder mask layer 160 is respectively formed on another portion of the dielectric layers 110 and cover a portion of the first conductive structures 150, wherein the solder mask layers 160 have a plurality of second openings 162 exposing another portion of the first conductive structure 150.

Figure 3F:
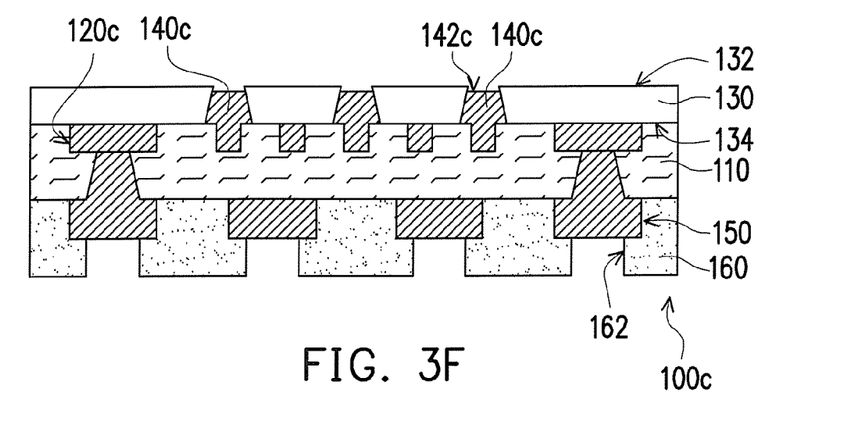

Lastly, referring to both FIG. 3E and FIG. 3F, the first copper foil structure 20a, the second copper foil structure 20b, and the core dielectric layer 10 are removed to expose the surfaces 132 of the insulation layers 130 and the conductive blocks 140c. Specifically, the first thin copper foil layer 24a and the second thin copper foil layer 24b are separated from the core dielectric layer 10, the first thick copper foil layer 22a, and the second thick copper foil layer 22b by peeling the first release layer 26a and the second release layer 26b. Then, an etching process is performed to etch the first thin copper foil layer 24a and the second thin copper foil layer 24b to expose the surfaces 132 of the insulation layers 130 and the conductive blocks 140c. It should be mentioned that, due to the adjustments of the etching process, the surfaces 142c of the conductive blocks 140c can be lower than or level with (not illustrated) the surfaces 132 of the insulation layers 130. At this point, the manufacture of the carrier substrate 100c is complete.

It should be mentioned that, the invention does not limit the number of the dielectric layer 110 and the conductive circuit layers (such as the second circuit layer 150b and the first circuit layer 120c). Although the dielectric layer 110 mentioned in FIG. 3F substantially only has one layer, however, the conductive circuit layer substantially has two layers (the first circuit layer 120c and the second circuit layer 150). However, in other unillustrated embodiments, after the step of FIG. 3D, that is, after forming the second circuit layers 150 on the dielectric layers 110, the steps of FIG. 3C to FIG. 3D can also be repeated once or a plurality of times to form a built-up structure, which still belongs to the usable technical solution of the invention and does not depart from the scope of the invention to be protected.

For instance, referring to FIG. 3F', the carrier substrate 100d of the present embodiment can further include a built-up structure 150'. Specifically, the built-up structure 150' is disposed on the surface 114 of the second circuit layer 150b and the dielectric layer 110. The built-up structure 150' includes at least one built-up dielectric layer 152 and a second conductive structure 154 disposed on the built-up dielectric layer 152, wherein the second conductive structure 154 at least includes a plurality of second conductive vias 154a disposed in the built-up dielectric layer 152 and a built-up circuit layer 154b disposed on a portion of the built-up dielectric layer 152, and a portion of the second conductive vias 154a connect with the second circuit layer 150b. The solder mask layer 160 is disposed on another portion of the outermost built-up dielectric layer 152 of the built-up structure 150' and covers a portion of the outermost second conductive structure 154, wherein the solder mask layer 160 has a plurality of second openings 162 exposing another portion of the second conductive structure 154.

In short, the carrier substrate 100d of the present embodiment has two dielectric layers (dielectric layer 110 and built-up dielectric layer 152) and three conductive circuit layers (first circuit layer 120c, second circuit layer 150b, and built-up circuit layer 154b). Here, the conductive blocks 140c filling the first openings 136 of the insulation layer 130 are suitable for electrically connecting, for instance, with a chip having smaller electrical linewidth/line distance (not illustrated), wherein conductive bumps (not illustrated) for connection are arranged on the chip. The built-up circuit layer 154b of the second conductive structure 154 exposed by the second openings 162 of the solder mask layer 160 can be viewed as a connection pad suitable for electrically connecting, for instance, with a printed circuit board having greater electrical spacing. In this way, the carrier substrate 100d of the present embodiment is suitable for carrying components of different electrical spacings.

Figure 4:
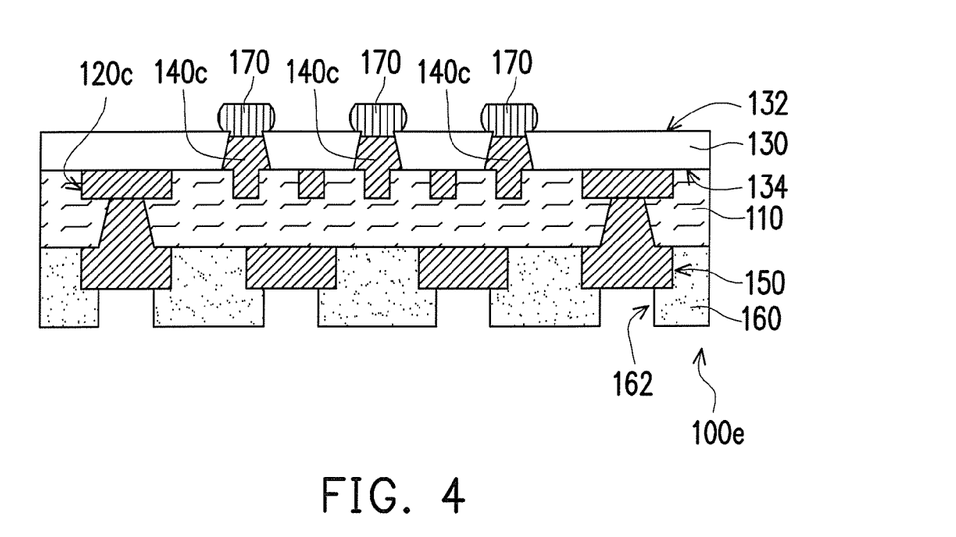
FIG. 4 illustrates a cross-sectional schematic diagram of a carrier substrate of an embodiment of the invention.

In other embodiments, referring to FIG. 4, after the step of FIG. 3F, that is, after removing the first copper foil structure 20a, the second copper foil structure 20b, and the core dielectric layer 10, a plurality of solder balls 170 can be respectively formed on the conductive blocks 140c, wherein the solder balls 170 respectively connect with the conductive blocks 140c to complete the manufacture of the carrier substrate 100e.

Alternately, referring to FIG. 4', after the step of FIG. 3F, that is, after removing the first copper foil structure 20a, the second copper foil structure 20b, and the core dielectric layer 10, a plurality of conductive bumps 180 can be respectively formed on the conductive blocks 140c, wherein the conductive bumps 180 respectively connect with the conductive blocks 140c and cover a portion of the insulation layer 130 to complete the manufacture of the carrier substrate 100f.

Alternately, referring to FIG. 4", after the step of FIG. 3F, that is, after removing the first copper foil structure 20a, the second copper foil structure 20b, and the core dielectric layer 10, a plurality of conductive towers 190 can be respectively formed on the conductive blocks 140c, wherein each conductive tower 190 has a tip face 192 and a base face 194 opposite to each other and the diameter of each conductive tower 190 is increased gradually from the tip face 192 to the base face 194. Then, a plurality of solder bumps 195 is respectively formed to cover the conductive towers 190 to complete the manufacture of the carrier substrate 100g.

Figure 5:
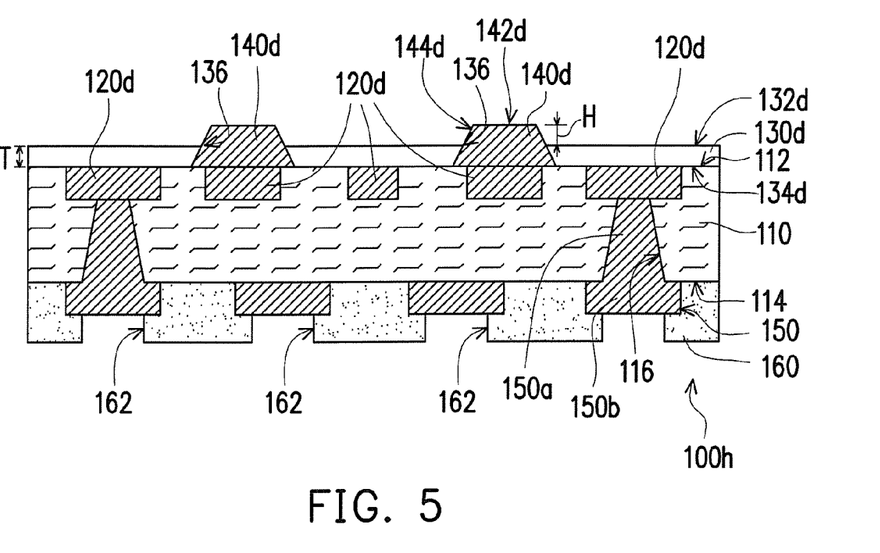
FIG. 5 illustrates a cross-sectional schematic diagram of a carrier substrate of another embodiment of the invention.

FIG. 5 illustrates a cross-sectional schematic diagram of a carrier substrate of another embodiment of the invention. Referring to FIG. 5, the carrier substrate 100h of the present embodiment is similar to the carrier substrate 100a of FIG. 1A and carrier substrate 100b of FIG. 2A, with the difference being that a top surface 142d of each of the conductive blocks 140d of the present embodiment is substantially higher than the surface 132d of the insulation layer 130d. In more detail, a height difference H is between the top surface 142d of each of the conductive blocks 140d and the surface 132d of the insulation layer 130d. Herein, the height difference H is at least greater than or equal to a thickness T of the insulation layer 130. In other words, each of the conductive blocks 140d is at least twice the thicker than the insulation layer 130, and the top surface 142d of each of the conductive blocks 140d protrudes out of the surface 132d of the insulation layer 130d.

As shown in FIG. 5, since the aperture of each first opening 136 is increased gradually from the surface 132d to the surface 134d, so a side surface 144d of each of the conductive blocks 140d is not a surface perpendicular to the surface 132d of the insulation layer 130d. Specifically, the side surface 144d of each of the conductive blocks 140d is inclined relative to the surface 132d of the insulation layer 130d. In other words, the side surface 144d of each of the conductive blocks 140d is an inclined surface. Furthermore, in terms of manufacturing processes, the height difference H may be formed by reducing the thickness of the insulation layer 130 described in FIG. 1 and FIG. 2, and a method of the reducing the thickness of the insulation layer 130 is a physical or chemical process. It should be mentioned here that, the first circuit layer 120d of the present embodiment, for example, can include a plurality of traces and a plurality of connection pads or only composed of a plurality of traces, but the disclosure is not limited thereto.

Briefly, the conductive blocks 140d are disposed on the first circuit layer 120d exposed by the first openings 136, and the top surface 142d of each of the conductive blocks 140d is substantially higher than the surface 132d of the insulation layer 130d. As a result, the conductive blocks 140d can be used as a structure for elevating a portion of the first circuit layer 120d. At the same time, the conductive blocks 140d can be viewed as bonding pads for components. In this way, in subsequent applications of the carrier substrate 100h of the embodiment in carrying components (such as capacitors, inductors, resistors, IC chips, or package), the component can be accurately connected with the conductive blocks 140d to increase the reliability of bonding between the carrier substrate 100h and the component.

Figure 6:
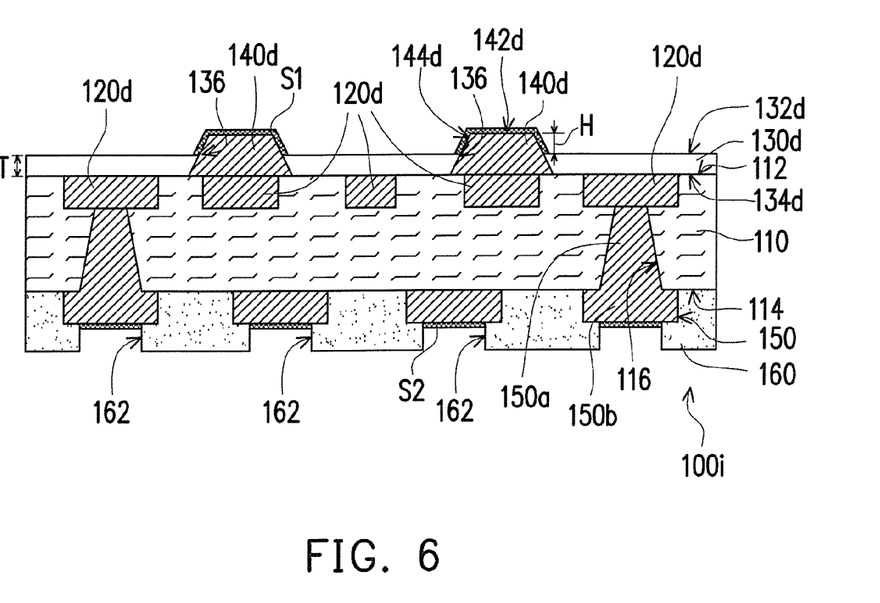
FIG. 6 illustrates a cross-sectional schematic diagram of a carrier substrate of another embodiment of the invention.

FIG. 6 illustrates a cross-sectional schematic diagram of a carrier substrate of another embodiment of the invention. Referring to FIG. 6, the carrier substrate 100i of the present embodiment is similar to the carrier substrate 100h of FIG. 5, with the difference being that the carrier substrate 100i further includes a first surface treatment layer S1 and a second surface treatment layer S2. In more detail, the first surface treatment layer S1 is disposed on the top surface 142d of each of the conductive blocks 140d and extends along the side surface 144d of each of the conductive blocks 140d on the surface 132d of the insulation layer 130d, so as to prevent the conductive blocks 140d being oxidized or polluted by external substances. Herein, a material of the first surface treatment layer S1 is organic solderability preservative (OSP), electroplating Ni/Au, electroplating Ni/Pd, electroplating Sn, electroplating Ag, electroless Au, electroless nickel electroless palladium immersion gold (ENEPIG) or a combination thereof. The second surface treatment layer S2 is disposed on another portion of the second circuit layer 150b, so as to prevent the second circuit layer 150b being oxidized or polluted by external substances. Herein, a material of the second surface treatment layer S2 is the same as a material of the first surface treatment layer S1, such as organic solderability preservative (OSP), electroplating Ni/Au, electroplating Ni/Pd, electroplating Sn, electroplating Ag, electroless Au, electroless nickel electroless palladium immersion gold (ENEPIG) or a combination thereof.

Based on the above, the first openings of the insulation layer of the invention expose a portion of the first circuit layer and the conductive blocks are disposed on the first circuit layer exposed by the first openings. As a result, the conductive blocks can be used as a structure for elevating a portion of the first circuit layer. At the same time, the conductive blocks can be viewed as bonding pads for components. In this way, in subsequent applications of the carrier substrate of the invention in carrying components (such as capacitors, inductors, resistors, IC chips, or package), the component can be accurately connected with the conductive blocks to increase the reliability of bonding between the carrier substrate and the component. Moreover, the insulation layer covers another portion of the first circuit layer, which can protect the first circuit layer to prevent the generation of oxidation phenomenon so as to maintain the electrical performance of the first circuit layer.

Although the invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A carrier substrate, comprising:
   a dielectric layer having a first surface and a second surface opposite to each other and a plurality of blind vias;
   a first circuit layer embedded in the first surface of the dielectric layer and having an upper surface and a lower surface opposite to each other, the upper surface exposed from the first surface of the dielectric layer, wherein the blind vias extend from the second surface to the first circuit layer and expose a portion of the lower surface of the first circuit layer;
   an insulation layer having a third surface and a fourth surface opposite to each other and disposed on the first surface of the dielectric layer through the fourth surface and covers a portion of the upper surface of the first circuit layer, the insulation layer having a plurality of first openings extending from the third surface to the fourth surface, wherein the first openings expose another portion of the upper surface of the first circuit layer, an aperture of each first opening is increased gradually from the third surface to the fourth surface, and the apertures of the first openings on the fourth surface are greater than a width of the exposed first circuit layer;
   a plurality of conductive blocks respectively disposed in the first openings of the insulation layer and connected with another portion of the upper surface of the first circuit layer exposed by the first openings, wherein a top surface of each of the conductive blocks is higher than the third surface of the insulation layer; and
   a first conductive structure disposed on the second surface of the dielectric layer and comprising a plurality of conductive vias filling the blind vias and a second circuit layer disposed on a portion of the second surface.

2. The carrier substrate as recited in claim 1, wherein a height difference is between the top surface of each of the conductive blocks and the third surface of the insulation layer, and the height difference is at least greater than or equal to a thickness of the insulation layer.

3. The carrier substrate as recited in claim 1, further comprising:
   a first surface treatment layer disposed on the top surface of each of the conductive blocks and extending along a side surface of each of the conductive blocks on the third surface of the insulation layer.

4. The carrier substrate as recited in claim 3, wherein the side surface of each of the conductive blocks is an inclined surface.

5. The carrier substrate as recited in claim 3, wherein a material of the first surface treatment layer comprising organic solderability preservative (OSP), electroplating Ni/Au, electroplating Ni/Pd, electroplating Sn, electroplating Ag, electroless Au, electroless nickel electroless palladium immersion gold (ENEPIG) or a combination thereof.

6. The carrier substrate as recited in claim 1, further comprising:
   a solder mask layer disposed on another portion of the second surface of the dielectric layer and covering a portion of the second circuit layer of the first conductive structure, wherein the solder mask layer has a plurality of second openings exposing another portion of the second circuit layer.

7. The carrier substrate as recited in claim 6, further comprising:
   a second surface treatment layer disposed on the another portion of the second circuit layer.

8. The carrier substrate as recited in claim 6, wherein a material of the second surface treatment layer comprising organic solderability preservative (OSP), electroplating Ni/Au, electroplating Ni/Pd, electroplating Sn, electroplating Ag, electroless Au, electroless nickel electroless palladium immersion gold (ENEPIG) or a combination thereof.

* * * * *